United States Patent [19]

Tanaka

[11] Patent Number: 5,248,380
[45] Date of Patent: Sep. 28, 1993

[54] METHOD OF TREATING SURFACE OF ROTATING WAFER USING SURFACE TREATING GAS

[75] Inventor: Masato Tanaka, Shiga, Japan

[73] Assignee: Mitsubishi Denki Kabushiki Kaisha, Tokyo, Japan

[21] Appl. No.: 788,633

[22] Filed: Nov. 6, 1991

[30] Foreign Application Priority Data

Nov. 6, 1990 [JP] Japan .................................. 2-301872

[51] Int. Cl.⁵ .............................................. B05D 1/00
[52] U.S. Cl. ................................... 156/626; 156/640; 156/646; 134/31; 134/33; 427/8; 427/255.5
[58] Field of Search .................... 156/626, 640, 646; 134/33, 31; 427/8–10, 255.5, 248.1

[56] References Cited

U.S. PATENT DOCUMENTS

| | | | |
|---|---|---|---|
| 4,544,446 | 10/1985 | Cady | 156/626 X |
| 4,681,776 | 7/1987 | Bok | 427/255.5 X |
| 4,980,204 | 12/1990 | Fujii et al. | 427/255.5 X |
| 5,032,217 | 7/1991 | Tanaka | 156/626 X |

FOREIGN PATENT DOCUMENTS 62-165925  7/1987  Japan .
3-72626  3/1991  Japan .
3-80537  4/1991  Japan .

*Primary Examiner*—Thi Dang
*Attorney, Agent, or Firm*—Lowe, Price, LeBlanc & Becker

[57] ABSTRACT

A surface treatment method of treating a main surface of a wafer by a surface treating gas while rotating the wafer at a predetermined rotation speed includes the steps of: determining, before surface treatment of the product wafer, a first rotation speed at which the result of a comparison between the speed of surface treatment in the center of rotation of the main surface of a product wafer and the speed of surface treatment in the periphery of it is inverted; and supplying a surface treating gas to the main surface of the product wafer while rotating the product wafer at the determined first rotation speed. The first rotation speed is selected to be corresponding to the inflection point of a curved line of a function which represents the relation between the surface treatment rate and the rotation speed of the wafer. Surface treatment is carried out at uniform treatment rate over the whole surface of the wafer by rotating the wafer the first rotation speed.

23 Claims, 13 Drawing Sheets

METHOD OF TREATING SURFACE OF ROTATING WAFER USING SURFACE TREATING GAS

BACKGROUND OF THE INVENTION

1. Field of the Invention

The present invention relates to a method of treating a surface of a rotating wafer for carrying out various surface treatment such as etching, cleaning of the surface of the wafer, and formation of films on the surface of the wafer by supplying a gas for surface treatment such as etching and cleaning and a gas for forming films and the like to the surface of various wafers such as a semiconductor wafer while rotating the wafers in a horizontal plane, and, more particularly, to a technique for enhancing uniformity of surface treatment of a wafer over the whole surface of the wafer in a manufacturing process of a semiconductor device.

2. Description of the Related Art

It is possible to carry out surface treatment of a wafer such as a semiconductor wafer by supplying gases for various surface treatment over the whole surface of the wafer while rotating the wafer in a horizontal plane. Thus, etching and cleaning of the surface of a wafer and formation of films on the surface of the wafer, for example, are carried out. So far, a technique disclosed in Japanese Patent Laying-Open No. 62-165925 (1987) has been used as a method for carrying out treatment uniformly in the whole area of the surface of the wafer to be treated. The laid open application discloses a diffusion plate having openings of various shapes for supplying a gas uniformly to the surface of the wafer. Specifically, according to the laid open application, the diffusion plate is arranged opposite the wafer to be treated, spaced a predetermined distance apart from the wafer. A surface treating gas is supplied uniformly toward the surface of the wafer through openings of various shapes formed in the diffusion plate.

Furthermore, there is a technique in which a diffusion plate is provided a part of the diffusion plate for discharging a surface treating gas is rotated or a wafer under treatment is rotated by rotating a table for carrying the wafer. In these techniques, the optimum condition for carrying out uniform treatment was found out by trial-and-error, and surface treatment was carried out in accordance with that condition.

In the conventional methods, however, the condition for carrying out uniform surface treatment of a wafer varies depending on the supplied flow rate of a surface treating gas, the exhausting ratio from a surface treatment chamber and the like. Therefore, it was extremely difficult to set a condition of making it possible to carry out surface treatment uniformly over the whole surface of a wafer, and it was especially difficult to numerically represent the condition in the conventional methods.

SUMMARY OF THE INVENTION

Accordingly, an object of the present invention is to make it possible to set a condition which enables uniform surface treatment over the whole surface of a wafer to be treated in a simple way in a method of treating the surface of a wafer by supplying a surface treating gas to the surface of the wafer while rotating the same.

Another object of the present invention is to make it possible to set a condition which enables uniform surface treatment over the whole surface of a wafer to be treated in a simple way by following a predetermined procedure in a method of treating the surface of a wafer by supplying a surface treating gas to the surface of the wafer while rotating the same.

Still another object of the present invention is to make it possible to set a condition which enables uniform surface treatment over the whole surface of a wafer to be treated in a simple way by following a predetermined definite procedure in a method of treating the surface of a wafer by supplying a surface treating gas to the surface of the wafer while rotating the wafer.

An additional object of the present invention is to make it possible to numerically specify a condition which enables uniform surface treatment over the whole surface of a wafer to be treated in a simple way by following a predetermined definite procedure in a method of treating the surface of a wafer by supplying a surface treating gas to the surface of the wafer while rotating the wafer.

A method of treating the surface of a wafer according to the present invention includes the steps of: determining a first rotation speed of a product wafer at which the result of a comparison between the speed of surface treatment in the vicinity of the center of rotation of a main surface of the product wafer and the speed of surface treatment in the periphery of the same is inversed before treating the surface of the product wafer; and supplying a surface treating gas to a main surface of the product wafer while rotating the product wafer at the first rotation speed.

According to the above method, the speed of surface treatment in the vicinity of the center of rotation of the wafer and the speed of surface treatment in the peripheral part of the wafer are approximately equal at the first rotation speed. Surface treatment is carried out at approximately the same speed in the central part and the peripheral part of the wafer. In addition, it is found out that fluctuations in the speed of surface treatment over the whole surface of the wafer are small in treatment at this rotation speed. Therefore, it is possible to treat the surface of a wafer uniformly in accordance with this method. Furthermore, the condition of such a rotation speed is definite, so that even an inexperienced operator can specify it relatively easily.

Another aspect of the present invention relates to a method of determining a first rotation speed in a method of treating a main surface of a wafer by supplying a surface treating gas to the main surface of the wafer while rotating the surface having the main surface around an axis vertical to the main surface at the predetermined first rotation speed. The method includes the steps of: determining, before surface treatment of the product wafer, a second rotation speed of a test wafer of the same kind as a product wafer at which the result of a comparison between the speed of surface treatment in the vicinity of the center of rotation of the test wafer and the speed of surface treatment in the peripheral part of it is inverted; and selecting the value of the first rotation speed to be equal to the second rotation speed.

According to this method, the speed of surface treatment in the vicinity of the center of rotation of the test wafer and the speed of surface treatment in the periphery of it are approximately equal at the second rotation speed. The central part and peripheral part of the test wafer are treated at approximately the same speed, and therefore the surface of the product wafer is also treated at approximately the same speed. In addition, it is found out that fluctuations in the speed of surface treatment over the whole surface of a wafer are small in treatment at this rotation speed. Accordingly, it is possible to carry out surface treatment uniformly over the whole surface of a wafer. Furthermore, such a rotation speed can be selected by following a definite procedure, so that even an inexperienced operator can find out it relatively easily.

According to a preferred embodiment of the present invention, the step of determining the second rotation speed includes the steps of preparing a plurality of test wafers, carrying out surface treatment of the prepared plurality of test wafers, respectively, while rotating them at different rotation speeds, respectively, determining at least a function representing the relation between the treatment rate on a main surface of each of the surface-treated test wafers and the test wafer rotation speeds and finding out a rotation speed corresponding to the inflection point of the function representing the treatment speed and selecting it as a second rotation speed.

According to the above method, the mean treatment speed on the surfaces of the test wafers subject to treatment while being rotated at different rotation speeds is represented as a function of the rotation speed of the test wafer. It has been found that, at the rotation speed at the inflection point of that function, the result of a comparison between the speed of surface treatment in the vicinity of the center of rotation and the speed of surface treatment in the peripheral part is inverted. Accordingly, it is possible to specify the rotation speed of a product wafer more easily by finding out such a function and specifying its inflection point.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiments according to the present invention will be described in the following. Treatment in which a thermal oxide film on a silicon wafer is etched using hydrogen fluoride (HF) vapor will be described as an example of surface treatment in the following embodiment. However, the present invention is not limited to this treatment, and it is also applicable to cleaning of the surfaces of various wafers, film formation processing and the like. The film to be treated may be an insulating film or the like other than a thermal oxide film. The used vapor is not limited to hydrogen fluoride (HF) vapor, and it may be a vapor of chemicals such as hydrochloric acid (HCl) vapor, nitric acid ($HNO_3$) vapor or the like or a gas such as ozone ($O_3$).

Figure 1:
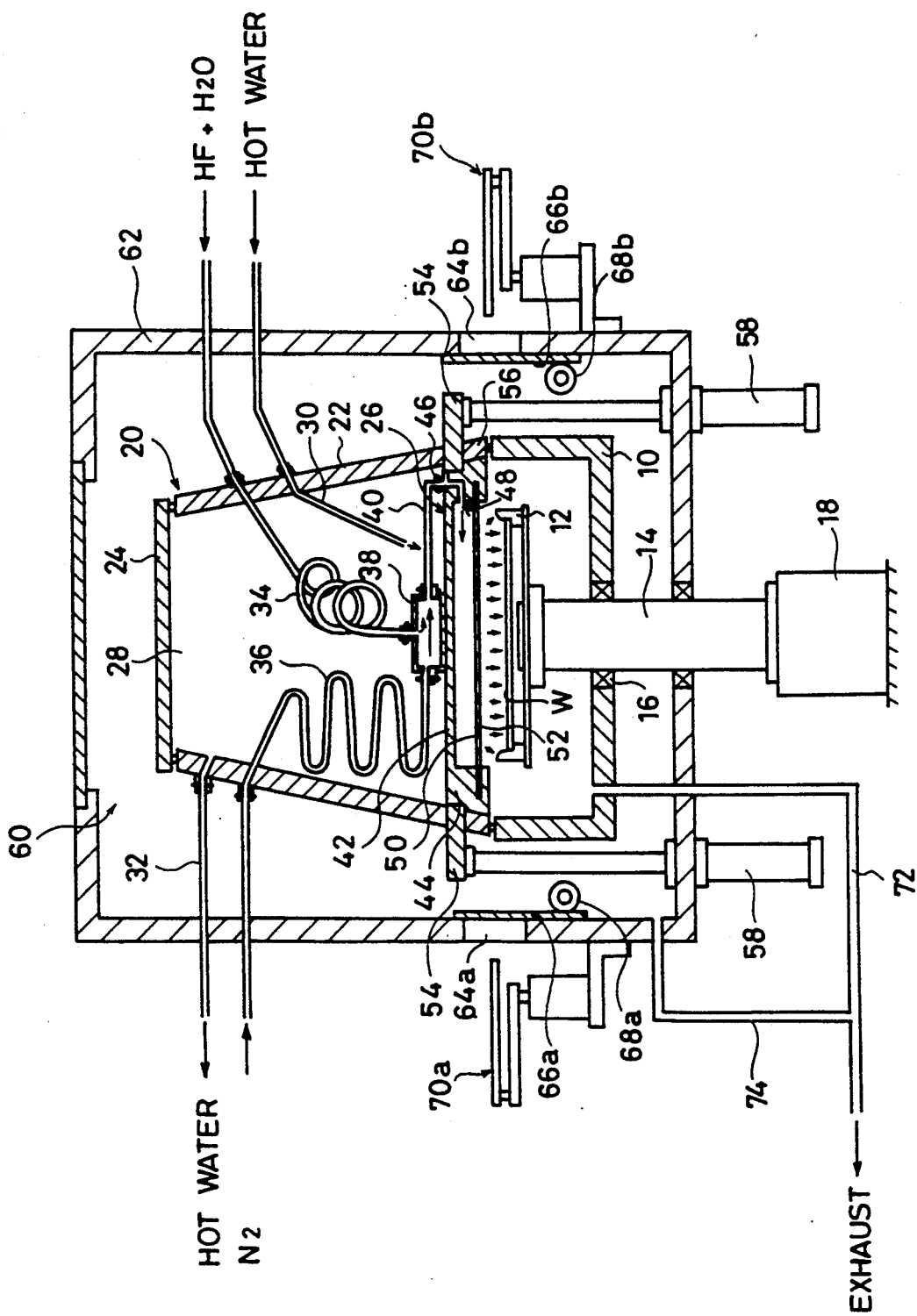
FIG. 1 is a longitudinal sectional view of an example of an apparatus for treating the surface of a rotating wafer used for carrying out a method according to the present invention.

Referring to FIG. 1, an apparatus for treating the surface of a rotating wafer for carrying out a method according to the present invention includes a housing 62 and a main processing part 60 provided in housing 62. Main processing part 60 includes a cylindrical wafer treatment chamber 10 having a bottom and a mechanical chuck 12 provided in wafer treatment chamber 10 for holding a wafer W such as a semiconductor wafer. The rotation axis 14 of mechanical chuck 12 is supported vertically by a bottom plate of wafer treatment chamber 10 by means of a bearing 16 which also serves as a sealing. The lower end of the rotation axis 14 is coupled to a motor 18 provided under the bottom plate of housing 62. The rotation axis of motor 18 rotates to cause mechanical chuck 12 to rotate in wafer treatment chamber 10. Therefore, the wafer W held by mechanical chuck 12 is rotated around a vertical axis in a horizontal plane in wafer treatment chamber 10.

An opening is provided to the upper end of wafer treatment chamber 10, and the opening is covered with a cover 20 in the shape of an inverted cup. Cover 20 includes a tapered peripheral wall portion 22, a top plate 24 integrally formed with the upper part of peripheral wall portion 22 in a watertight manner, and a chamber 26 formed integrally with the lower part of peripheral wall portion 22 in a watertight manner.

Cover 20 defines a constant temperature hot water tank 28. Peripheral wall portion 22 is provided with a tube 30 for supplying hot water for making hot water at a predetermined temperature fills hot water tank 28 and a tube 32 for discharging hot water from hot water tank 28.

The inside of hot water tank 28 is provided with a tube 34 for supplying a gas for etching the surface of wafer W to a predetermined position and a tube 36 for supplying nitrogen ($N_2$) gas as a carrier gas to the predetermined position, which are provided through peripheral wall 22, respectively. In the case of the apparatus illustrated in FIG. 1, a gas for surface treatment of a wafer includes a mixed vapor of hydrogen fluoride (HF) gas and pure water ($H_2O$). The bottom of hot water tank 28 is provided with an aspirator 38 connected to tubes 34, 36 for drawing the gas for treating the surface of a wafer from tube 34 by a negative pressure generated by the flow of $N_2$ gas supplied from tube 36 and diluting the gas with $N_2$ gas and a tube 40 for supplying the gas for treating the surface of a wafer which has been diluted by aspirator 38 into chamber 26. Tubes 34, 36 are drawn through peripheral wall portion 22 to the outside of hot water tank 28 and housing 62, as described above and connected to supply source (not shown) of a mixed vapor and a supply source of nitrogen gas, respectively.

Tubes 34, 40, and aspirator 38 are provided in hot water tank 28 in order to prevent the mixed vapor of the surface treating gas of a wafer from being liquified. The temperature of tube 34 is controlled by a temperature controlling apparatus (not shown) over its whole length up to the supply source of the mixed vapor even outside constant temperature hot water tank 28. Tubes 34, 36 are bent in a helical manner or wound in hot water tank 28 as illustrated in FIG. 1. This causes the passage of tubes 34, 36 in hot water tank 28 to be longer and the area of contact thereof with hot water for heat exchange to be larger, so that the temperature of each of the mixed vapor of the gas for surface treatment of a wafer and the carrier gas becomes more stable.

Chamber 26 includes a top plate portion 42 and a peripheral wall portion 44 which are integrally formed. Aspirator 38 is placed and fixed on top plate portion 42. A connection port is formed extending from top plate portion 42 to peripheral wall portion 44 in the peripheral part of top plate portion 42. A connector 46 of tube 40 is screwed into the connection port in an airtight manner. A gas inlet 48 is formed in peripheral wall portion 44 to be communicated with the inside of chamber 26 in a direction at an angle of 30° with the direction of the radius of chamber 26. The angle made by gas inlet 48 with the direction of the radius of chamber 26 is not limited to 30°, and it may be of an other value Gas inlet 48 is communicated with connector 46 of tube 40. A stepped part is formed on the lower surface side of peripheral wall portion 44. A porous plate 50 is fixed to the stepped part, and a bottom surface of chamber 26 is formed with porous plate 50. Porous plate 50 has a number of small holes 52 each having a diameter of about 1 to about 2 mm formed with a small pitch in a lattice pattern.

A pair of support plates 54 are mounted to chamber 26 at an angle of 90° with connector 46, respectively. It should be noted that gas inlet 48 and support plate 54 are drawn as if in the same plane in FIG. 1 for simplifying the drawing. Peripheral wall portion 22 of cover 20 is connected to the outer peripheral surface of peripheral wall portion 44 of chamber 26 in a watertight manner. Support plate 54 penetrates peripheral wall portion 22 in a watertight manner and projects to the outside of cover 20.

As described above, gas inlet 48 is formed inclined at a predetermined angle with the direction of the radius of chamber 26 in the apparatus illustrated in FIG. 1. The gas for treating the surface of a wafer introduced into chamber 26 rotates in a swirling manner in chamber 26. Therefore, the pressure of the gas for surface treatment of a wafer becomes higher near peripheral wall portion 44 than in the center in chamber 26.

Support plate 54 of cover 20 is mounted at the upper end of piston rods of a pair of air cylinders 58 mounted on the lower surface of the bottom of housing 62. Extension of air cylinders 58 causes cover 20 to rise. Retraction of air cylinders 58 causes cover 20 to fall and abut against the upper edge of wafer treatment chamber 10. A packing 56 is provided to the upper edge of wafer treatment chamber 10, and wafer treatment chamber 10 is isolated from the outside in an airtight manner by cover 20 and packing 56.

An inlet 64a and an outlet 64b for carrying a wafer W into and out of wafer treatment chamber 10 are formed at positions corresponding to the height of mechanical chuck 12 in housing 62. Inlet 64a and outlet 64b are provided with shutters 66a, 66b each having a rack, which are capable of closing inlet 64a and outlet 64b, respectively, pinion gears 68a, 68b engaged with the racks of shutters 66a, 66b, respectively, and a motor (not shown) connected to pinion gears 68a, 68b, respectively, for driving these gears 68a, 68b. Driving by the motor causes shutters 66a, 66b to slide, respectively, and they can open and close inlet 64a and outlet 64b, respectively.

A wafer carry-in mechanism 70a having a folding arm for holding wafer W by suction and carrying wafer W into housing 62 through inlet 64a is provided in the vicinity of inlet 64a outside housing 62. Wafer carry-in mechanism 70a is capable of transferring wafer W to mechanical chuck 12 when cover 20 is raised and wafer treatment chamber 10 is opened. A wafer carry-out mechanism 70b having the same structure as that of wafer carry-in mechanism 70a for carrying wafer W out of housing 62 is provided in the vicinity of outlet 64b outside housing 62.

An opening is provided in the bottom plate of wafer treatment chamber 10, and the opening is connected to an exhaust tube 72 for exhausting the air in wafer treatment chamber 10. An opening is provided in the lowest part of the peripheral wall of housing 62, and the opening is connected to a tube 74 for exhausting the air in housing 62. Tubes 72 and 74 join together on the way and are connected to a forced exhaust mechanism (not shown).

The apparatus illustrated in FIG. 1 operates as follows.

Hot water at a predetermined temperature is supplied from a hot water supply part (not shown) through tube 30 into hot water tank 28. Heat exchange is carried out between the hot water in tank 28 and $N_2$ gas and the gas for treating the surface through tubes 34, 36, and then the hot water is discharged from tube 32 to the outside. This causes the temperature of the hot water in tank 28 and $N_2$ gas and the gas for treating the surface of a wafer supplied to chamber 38 to be maintained constant.

Pinion gear 68a is driven by the motor (not shown). Shutter 66a falls, and wafer inlet 64a is opened. Wafer outlet 64b is closed by shutter 66b. Air cylinder 58 is extended to cause cover 20 to rise. A space where wafer carry-in mechanism 70a can enter is formed between cover 20 and mechanical chuck 12. Wafer carry-in mechanism 70a holds wafer W on the upper surface of the end of its arm by vacuum suction. The arm of wafer carry-in mechanism 70a is extended to cause wafer W to enter housing 62 through inlet 64a. Wafer W is positioned on mechanical chuck 12, and mechanical chuck 12 holds wafer W. Wafer carry-in mechanism 70a recedes therefrom to the outside of housing 62 through inlet 64a. Inlet 64a is closed by making shutter 66a rise.

Subsequently, air cylinders 58 are retracted to cause cover 20 to fall. Cover 20 presses down packing 56 on the upper edge of wafer treatment chamber 10 at its lower end surface and seals wafer treatment chamber 10. Motor 18 is activated, and wafer W is rotated around a vertical axis together with mechanical chuck 12.

A carrier gas ($N_2$ gas) is supplied from the $N_2$ gas supply part through tube 36 into aspirator 38. A negative pressure is caused in aspirator 38 by the passing $N_2$ gas. A mixed vapor of hydrogen fluoride (HF) gas and pure water ($H_2O$) is drawn into aspirator 38 through tube 34, mixed with $N_2$ gas, and diluted. The gas for treating the surface of a wafer which has been diluted is supplied from gas inlet 48 through tube 40 into chamber 26. At this time, the gas forms an eddy current in chamber 26 as described above. Therefore, the pressure of the gas becomes higher as a function of the distance from the center of rotation of wafer W. The gas for treating the surface of a wafer is supplied through porous plate 52 to the surface of wafer W, and the surface of wafer W is etched.

When etching is ended, supply of $N_2$ gas and the gas for treating the surface of a wafer is stopped. Motor 18 is also stopped. Air cylinders 58 are extended, cover 20 is raised, and wafer treatment chamber 10 is opened. Shutter 66b is slided to open outlet 64b. Wafer carry-out mechanism 70b enter wafer treatment chamber 10 and receives wafer W from mechanical chuck 12. Wafer carry-out mechanism 70b folds its arm and carries wafer W through outlet 64b to the outside of housing 62. Subsequently, shutter 66b is slided, and outlet 64b is closed again.

An experiment in the following was conducted using the apparatus illustrated in FIG. 1. The rotation speed of wafer W was changed variously with other conditions kept the same in the experiment. The result of the experiment is represented in FIG. 2.

The condition of the experiment was as described in the following. P-type (100) silicon wafers each having a diameter of 6 inches with a silicon thermal oxide film having a thickness of approximately 10,000 Å formed on the surface were used as test wafers. The surface treating gas was supplied from a supply source wherein a mixed liquid of hydrogen fluoride (HF) and pure water ($H_2O$) was evaporated and diluted with nitrogen ($N_2$) gas. The temperature of the supply source of the surface treating gas was kept at 40° C. The supplied flow rate of the mixed vapor into chamber 26 was 10 l /min at a temperature of 40° C. The pressure in wafer treatment chamber 10 was kept constant. Etching processes were carried out for one minute with the rotation frequency of wafer W of 10 rpm, 100 rpm, 250 rpm, 300 rpm, and 500 rpm, respectively, with other conditions kept constant. The relation between the distance (mm) from the center of rotation of each wafer W and the etched depth (Å) on the surface of wafer W in that position was appreciated as to the wafers W obtained as a result of etching.

Figure 2:
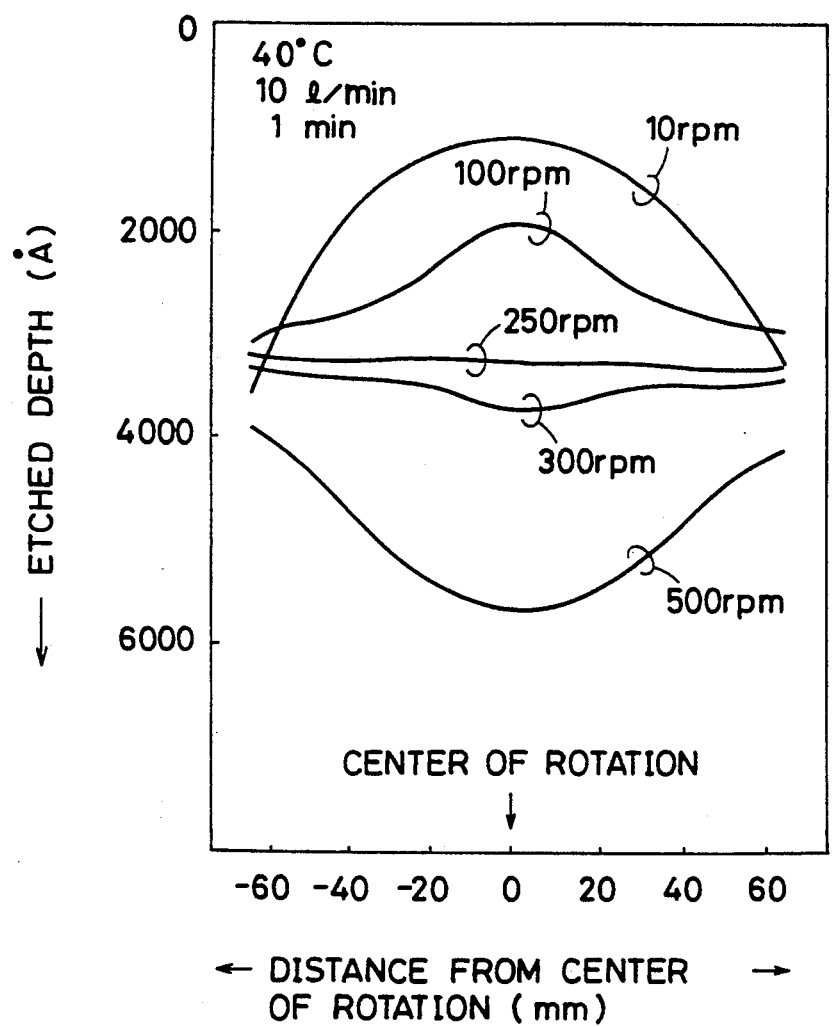
FIG. 2 is a graph representing the relation between the distance from the center of rotation of a wafer and an etched depth obtained as a result of an experiment carried out using the apparatus illustrated in FIG. 1 in which the wafers are rotated at different speeds.

Referring to FIG. 2, when the rotation speed of wafer W is small (see the curved line indicating the case of the rotation speed of 10 rpm), for example, the surface of wafer W is etched more strongly in the peripheral part than in the central part. Conversely, when the rotation speed of wafer W is large (see the curved line indicating the rotation speed of 500 rpm, for example), the surface of wafer W is etched more strongly in the central part than in the peripheral part. In the case of a medium rotation speed of a wafer, the difference between the etched depth in the central part of the surface of the wafer and that in the peripheral part of it becomes smaller. As illustrated in FIG. 2, the etched depth over the whole surface of wafer W becomes approximately uniform when wafer W is rotated at the rotation speed of 250 rpm under the condition of this experiment. This rotation speed is the transition point at which a change in rotational speed will produce a differential between the etching rates at the central and peripheral portions of the wafer, depending upon whether the change is an increase or a decrease in the rotational speed. If the rotational speed is increased, the central portion has a greater etching rate than the peripheral portion. If the rotational speed is decreased, the peripheral portion has a greater etching rate than the central portion. Thus, at the transition point the sign of the differential resulting from the comparison of the regional etching rates inverts. The differential is proportional to the amount of change in the rotational speed from the transition point, such that a large change in rotational speed results in a large differential between the etching rates.

It is seen from the above experiment result that etching processing may be carried out while rotation wafer W rotating at a particular speed in order to make uniformity over the surface of etching processing best. The speed may be the rotation speed at which the result of a comparison between the etching rates in the central and peripheral parts of wafer W is inverted. The subject matter of the present invention is that the above best rotation speed can be found out by carrying out an experiment with the rotation speed of wafers W changed variously under various conditions as described above, and, after this, surface treatment of wafer W is carried out at the found rotation frequency under the same condition. According to this, if other conditions are the same, surface treatment is carried out uniformly at a constant rate whether it is in the central part or in the peripheral part of the wafer by carrying out surface treatment while rotating wafer W at a rotation speed found out in advance. Repeatability of treatment is enhanced, and the most optimum rotation speed can be specified in a definite procedure, so that it is unnecessary to find out the rotation frequency by trial-and-error as conventionally done.

Figure 3:
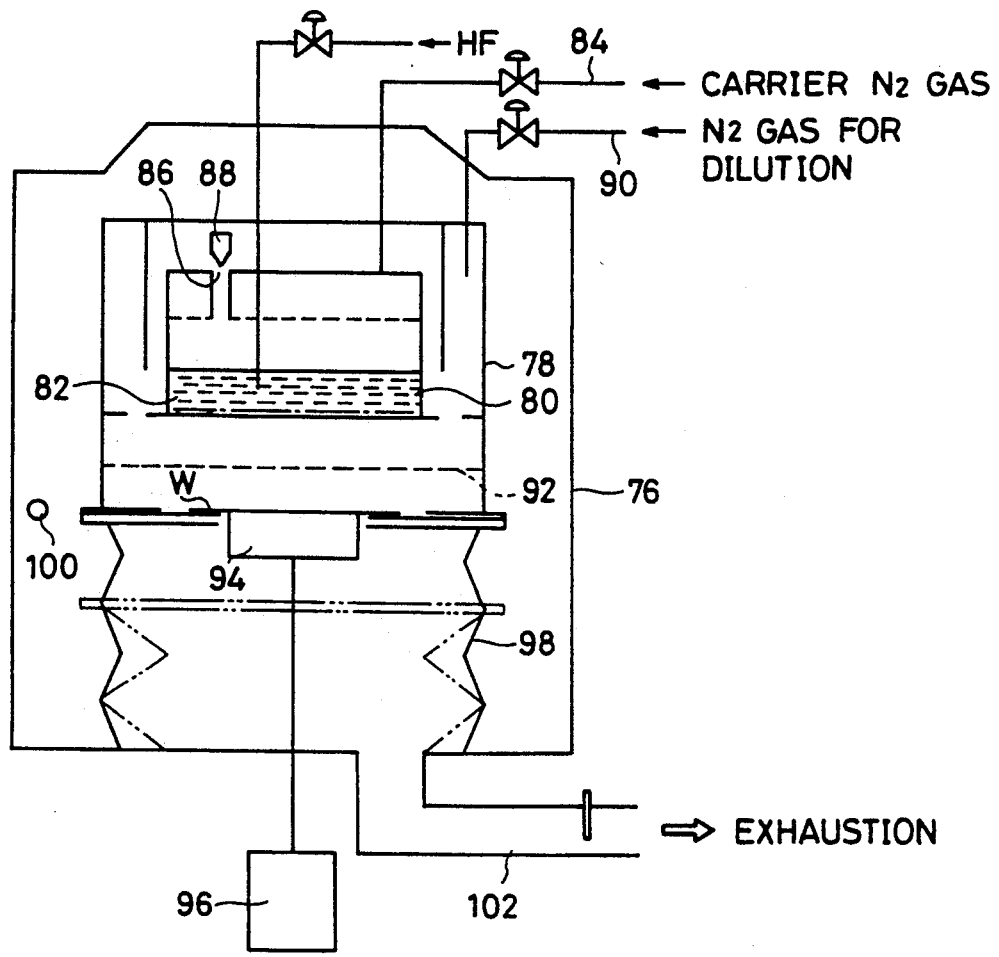
FIG. 3 is a typical diagram illustrating another apparatus for treating the surface of a rotating wafer used for carrying out a method according to the present invention.

FIG. 3 is a typical diagram illustrating another example of an apparatus for treating the surface of a rotating wafer for carrying out a method according to the present invention. A method of finding out a rotation speed of a wafer which makes uniformity over a surface of etching processing of the surface of wafer W best by using the apparatus illustrated in FIG. 3 will be described in the following.

The apparatus illustrated in FIG. 3 includes an outer housing 76 and a vapor generator (inner chamber) 78 made of fluororesin provided in housing 76. A hydrogen fluoride (HF) tank 80 is provided in vapor generator 78. Hydrogen fluoride (HF) 82 of azeotropic composition supplied from a hydrogen fluoride (HF) supply source (not shown) is stored in hydrogen fluoride (HF) tank 80. A supply path 84 of a carrier gas ($N_2$ gas) is communicated with a space defined by hydrogen fluoride (HF) tank 80. A vapor outlet 86 is provided in hydrogen fluoride (HF) tank 80. A valve 88 is provided to outlet 86. A supply path 90 of $N_2$ gas for dilution is communicated with a space surrounded by vapor generator 78. A hydrogen fluoride (HF) vapor supplying nozzle 92 is provided under hydrogen fluoride (HF) tank 80. Hydrogen fluoride (HF) vapor supplying nozzle 92 includes a flat plate with a number of openings formed therein.

A mechanical chuck 94 provided with a hot plate for supporting wafer W opposite nozzle 92 is provided under nozzle 92. A motor 96 for rotating mechanical chuck 94 is provided under the bottom plate of housing 76. Mechanical chuck 94 is coupled to the rotation axis of motor 96. Wafer W carried on mechanical chuck 94 is rotated together with mechanical chuck 94 by rotating the rotation axis of motor 96.

A bellows 98 is provided under vapor generator 78 in housing 76. A sensor 100 for detecting the concentration of hydrogen fluoride (HF) in housing 76 is provided outside bellows 98. An opening is formed in the bottom surface of housing 76, and the opening is communicated with an exhaust means (not shown) through an exhaust passage 102.

A series of experiments as described in the following was carried out using the apparatus illustrated in FIG. 3. A P-type (100) silicon wafer having a diameter of 6 inches in which a silicon thermal oxide film having a thickness of 5,000 Å is formed on the surface to be treated was used as test wafers W in the experiments. The temperature of hydrogen fluoride (HF) vapor supplied to the surface of the wafer and the temperature of the hydrogen fluoride (HF) vapor supply source in hydrogen fluoride (HF) tank 80 were maintained at 23° C., respectively. The temperature of wafer W was also maintained at 23° C. by the hot plate. Exhaustion was carried out only from inner chamber 78, and the exhausting ratio was adjusted and controlled by measuring the static pressure by a manometer and monitoring the exhausting ratio.

The gas for treating the surface of a wafer was supplied to the surface of wafer W as described in the following. Carrier $N_2$ gas which had the flow rate controlled by a mass flow controller was fed into hydrogen fluoride (HF) tank 80 to cause hydrogen fluoride (HF) vapor to flow out of the vapor supplying source in hydrogen fluoride (HF) tank 80 through outlet 86. Hydrogen fluoride (HF) vapor became a stream like an eddy current and reached nozzle 92, and supplied to the surface of wafer W through the openings formed in nozzle 92. Wafer W was rotated at a predetermined speed by motor 96 and mechanical chuck 94. The speed was changed to take various values as described above. The surface of wafer W which was opposite nozzle 92 was etched by hydrogen fluoride (HF) vapor supplied through nozzle 92. The reaction product (fluorosilicic acid) and superfluous hydrogen fluoride (HF) vapor were exhausted through exhaust passage 102.

FIGS. 4 to 7 represent a result observed as the result of a first series of experiments. In the series of experiments, the flow rate of hydrogen fluoride (HF) vapor was kept at 10SLM (Standard Liter/Minute : the flow rate per one minute represented in liter in the standard state of 0° C., 1atm). Etching of the silicon thermal oxide film was carried out with the exhausting ratio from inner chamber 78 being changed variously and the rotation speed of wafer W being changed. The change in the etching rate at this time is illustrated in the drawings.

Figure 4:
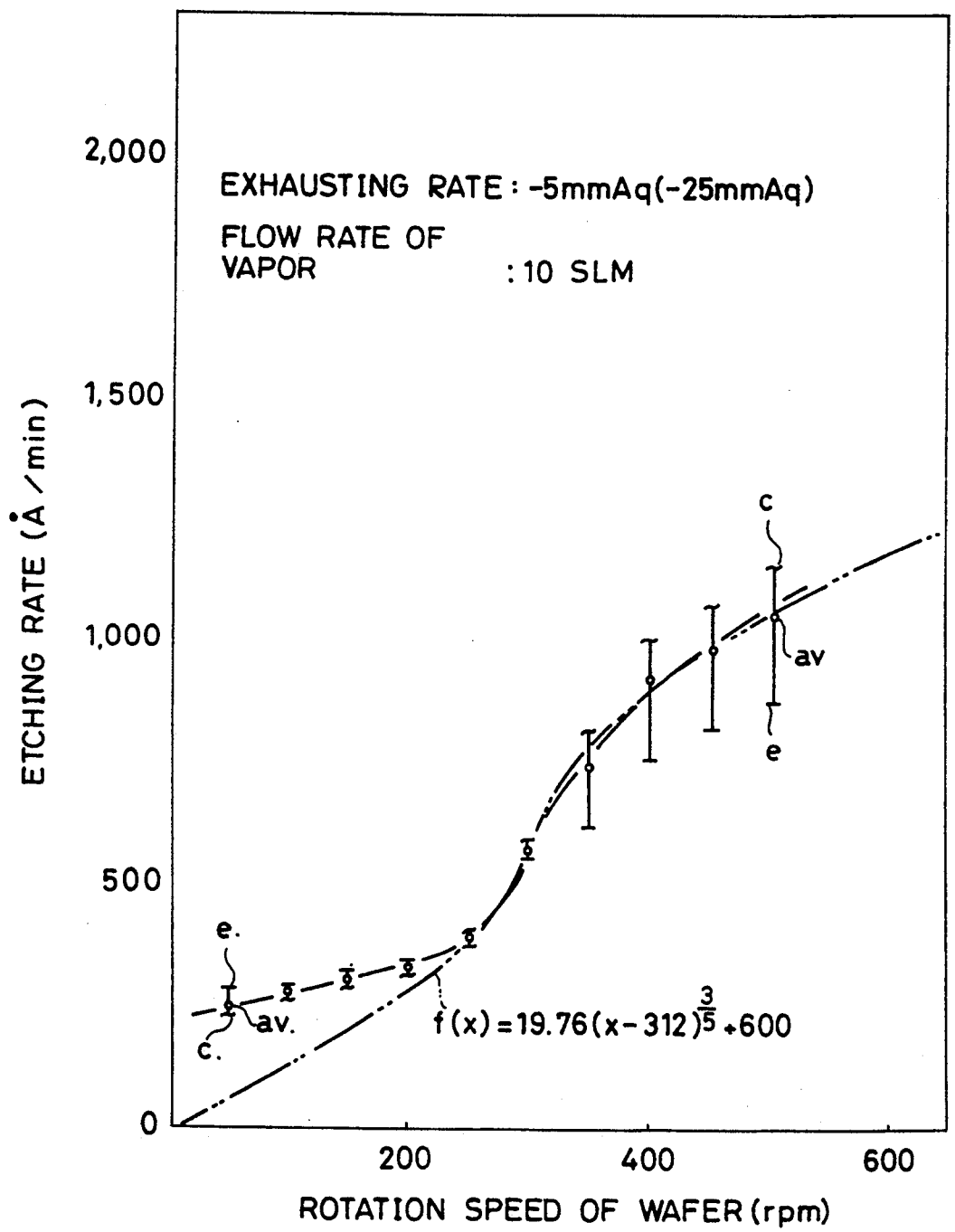
FIGS. 4 to 12 are graphs each representing the relation between the rotation speed of a wafer and the etching rate under various conditions in the result of an experiment carried out using the apparatus illustrated in FIG. 3.
Figure 5:
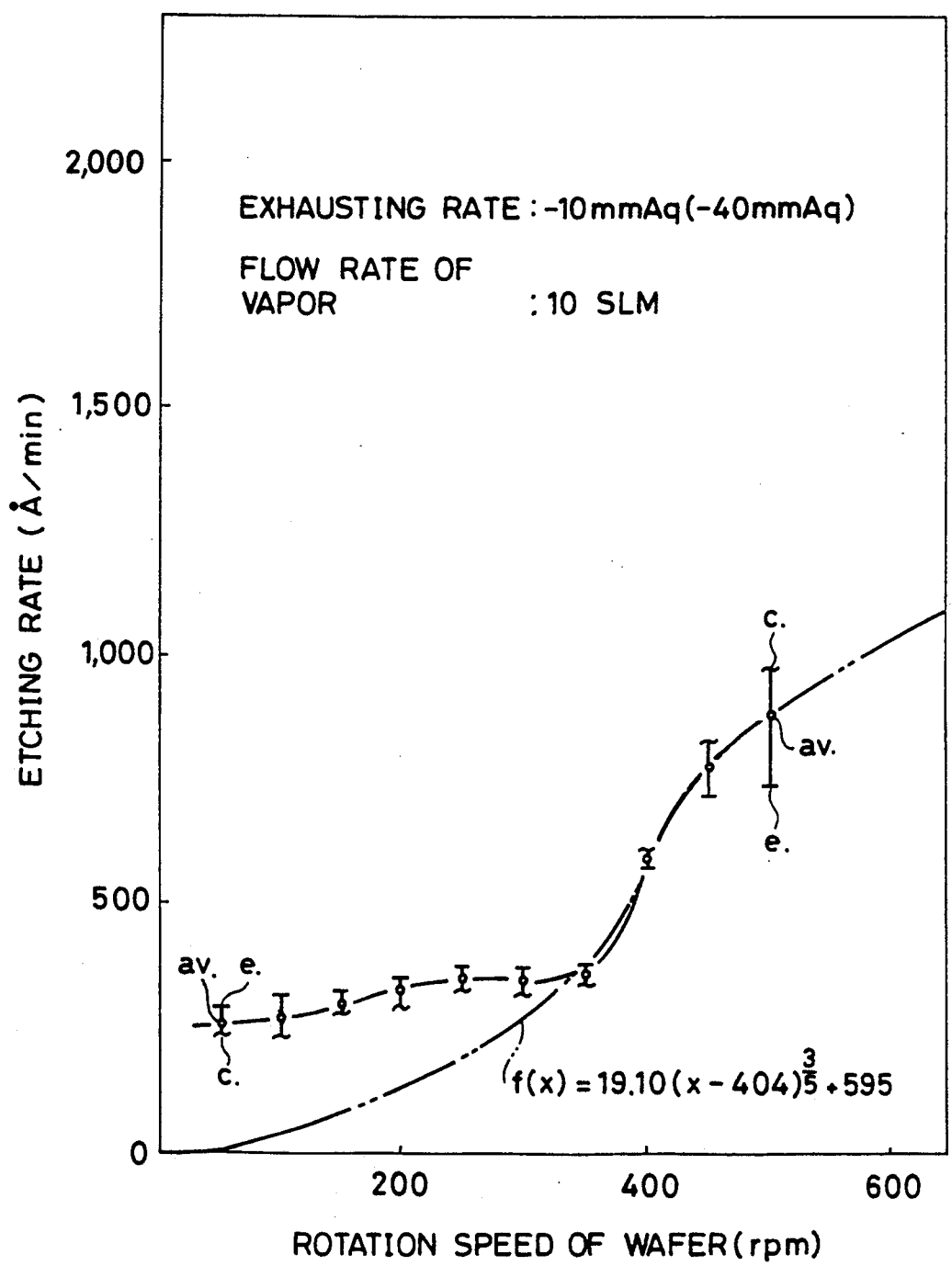
Figure 6:
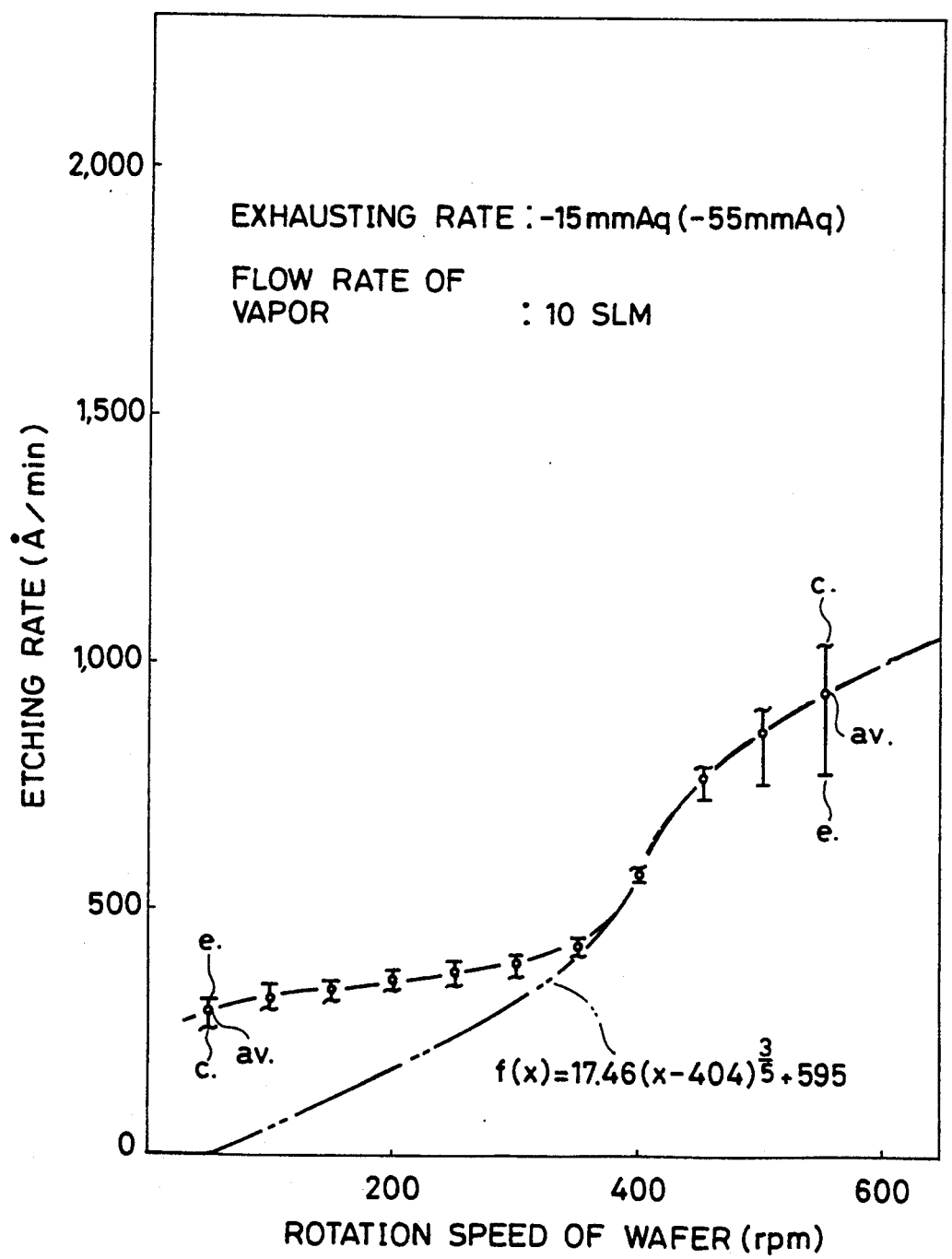
Figure 7:
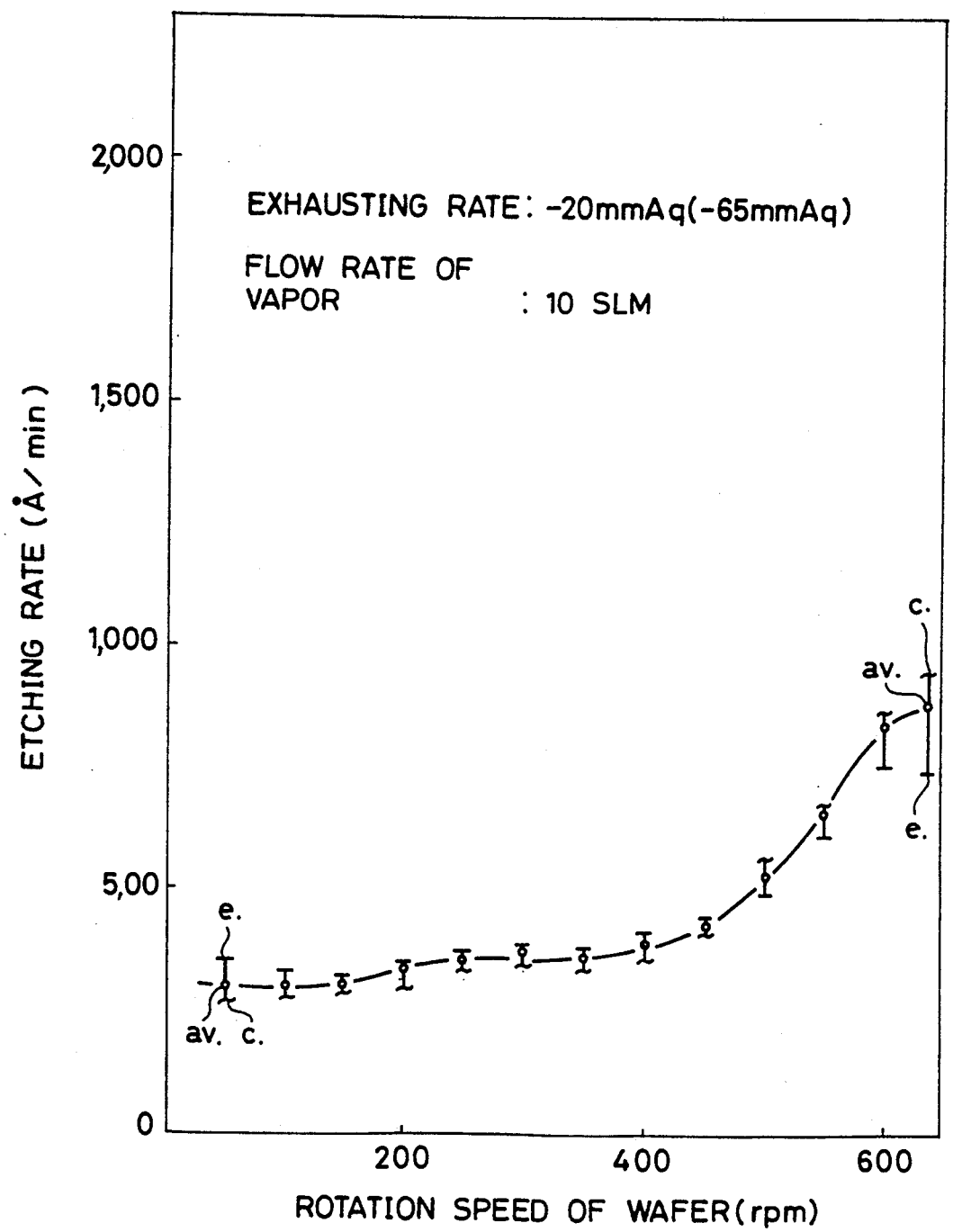

FIG. 4 represents the relation between the rotation speed of wafer W and the etching rate when the exhausting rate was −5 mmAq (when the inner chamber was open) (it was −25 mmAq when the inner chamber was closed and −23 mmAq when vapor was supplied). FIG. 5 represents the relation thereof when the exhausting rate was −10 mmAq (when the inner chamber was open) (it was −40 mmAq when the inner chamber was closed and −38 mmAq when vapor was supplied), FIG. 6 represents the relation when the exhausting rate was −15 mmAq (when the inner chamber was open) (it was −55 mmAq when the inner chamber was closed and −53 mmAq when vapor was supplied), and FIG. 7 represents the relation when the exhausting rate was −20 mmAq (when the inner chamber was open) (it was −65 mmAq when the inner chamber was closed and −63 mmAq when vapor was supplied).

In the experiments, 29 measuring points spaced 5 mm apart from each other were selected on a straight line which passes the center of rotation of wafer W. In FIGS. 4–7, the mean etching rate at the measuring point is indicated by a symbol "○", the value of the etching rate observed at a measuring point corresponding to the center of rotation of wafer W is indicated by a symbol "∼", and the value of the etching rate observed at a measuring point in the peripheral edge part of wafer W is indicated by a symbol "−". The vertical line segments in each drawing each indicate the range of the observed etching rate, i.e. the difference between the maximum value and the minimum value of the etching rate.

The following is seen from the curved lines in FIGS. 4–7. When wafer W is rotated at a low speed and when it is rotated at a high speed, uniformity over a surface of surface treatment of wafer W is not good, while the surface of wafer W is treated with a satisfactory uniformity over a surface in a medium-speed rotation area. When uniformity over the surface of wafer W becomes best in the medium-speed rotation area, the range of changes in the etching rate is only ±1.2% or less.

Figure 8:
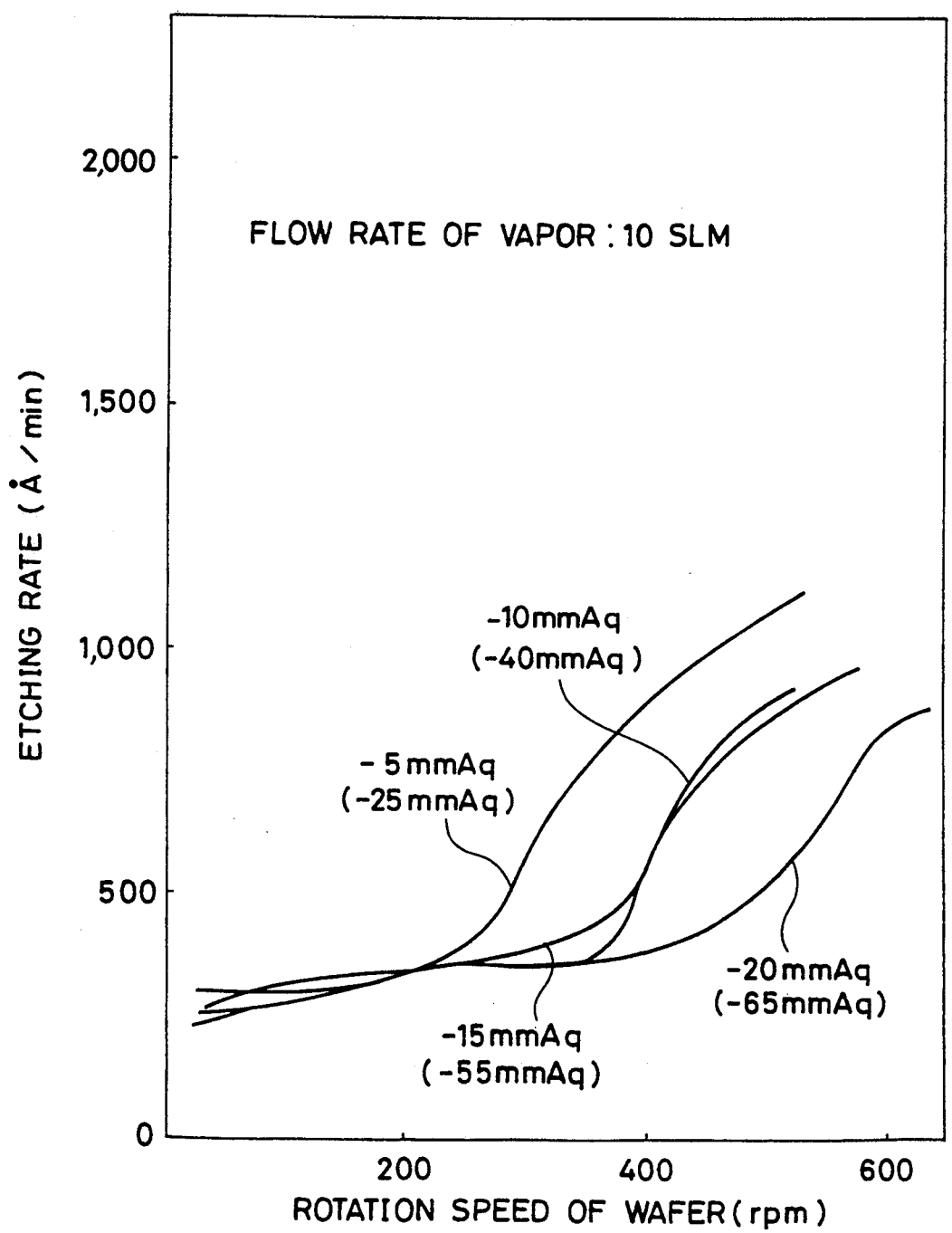

FIG. 8 represents the respective mean etching rate curves illustrated in FIGS. 4–7 superposed. Referring to FIG. 8, it is appreciated that the mean etching rate curve is shifted in a right direction (the direction in which the rotation speed of a wafer is increased) of the graph with little change in the basic form of the curve as the exhausting rate from the inner chamber is increased.

Figure 9:
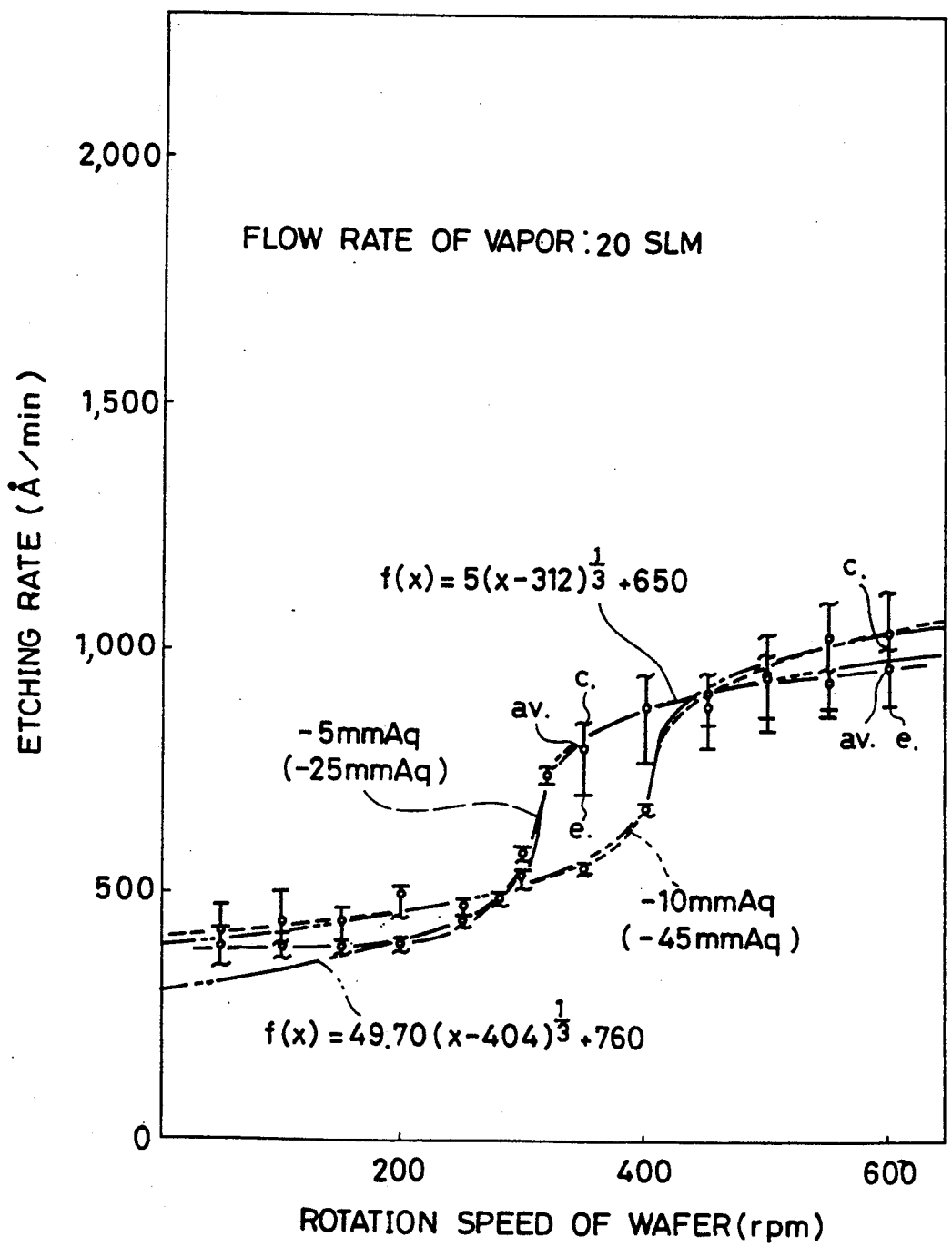

FIG. 9 illustrates this result of another series of experiments. In the series of experiments, the flow rate of hydrogen fluoride (HF) vapor was maintained at 20SLM. The experiments were carried out with respect to two values of the exhausting rate, −5 mmAq (when the inner chamber was open) (it was −25 mmAq when the inner chamber was closed and −22 mmAq when vapor was supplied) and −10 mmAq (when the inner chamber was open) (it was −45 mmAq when the inner chamber was closed and −42 mmAq when vapor was supplied) with the rotation speed being changed in a plurality of ways. In FIG. 9, the mean etching rate curve obtained under the former condition is represented by a solid-line curve, and the mean etching rate curve obtained by an experiment under the latter condition is represented by a broken-line curve.

It is also seen from FIG. 9 that the mean etching rate curve is shifted in a right direction with little change in the basic form of the curve in spite of increase in the exhausting rate. It is also seen that if the rotation speed of the wafer becomes higher, the etching rate in the central part of the wafer becomes higher than the etching rate in the peripheral part, and if the rotation speed becomes lower, the etching rate in the peripheral part of the wafer becomes higher than the etching rate in the central part as in the result illustrated in FIGS. 4–7. A result is also obtained that uniformity over a surface of treatment of the wafer becomes most favorable in the medium-speed rotation area where the etching rate in the central part of the wafer is approximately equal to the etching rate in the peripheral part.

While the mean etching rate curves illustrated in FIGS. 4–7 have approximately the same basic form, the mean etching rate curves illustrated in FIG. 9 have forms different from those in FIGS. 4–7. The two mean etching rate curves illustrated in FIG. 9 have basically the same form. The condition of the experiments illustrated in FIGS. 4–7 and the condition of the experiments illustrated in FIG. 9 differ only in the flow rate of the gas for treating the surface of the wafer. Accordingly, it is seen from these drawings that the basic form of the mean etching rate curve changes in accordance with the change in the flow rate of the etching gas.

Figure 10:
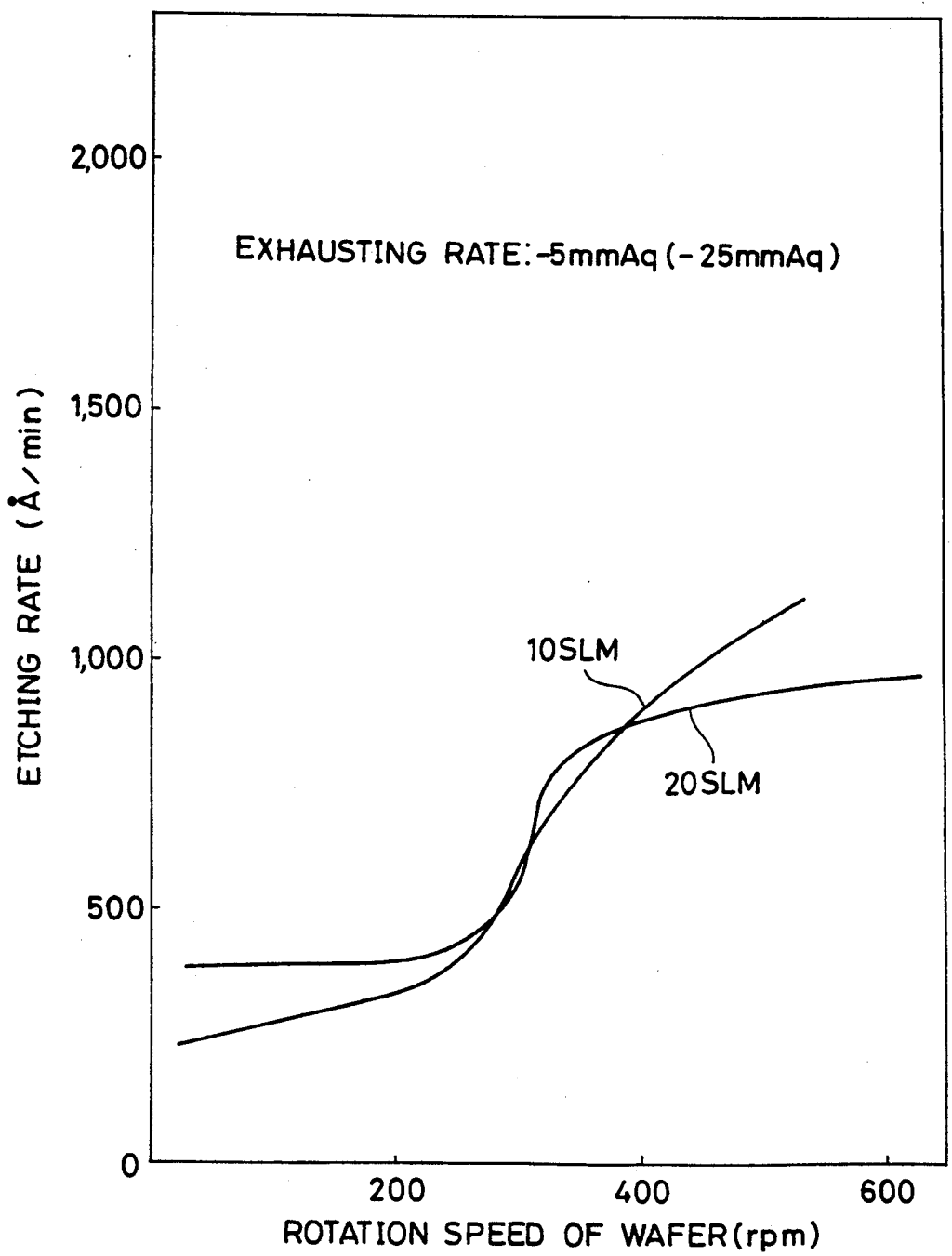

FIG. 10 represents the mean etching rate curve illustrated in FIG. 4 and the mean etching rate curve indicated by a solid line in FIG. 9 superposed. The two mean etching rate curves represent the result of an experiment carried out under the condition wherein the exhausting rate was −5 mmAq (when the inner chamber was open) (−25 mmAq when the inner chamber was closed) as to both of them, and the gas for treating the surface of the wafer was 10 SLM and 20 SLM, respectively. It is seen from FIG. 10 that the forms of the two mean etching rate curve differ greatly in the area where the rotation speed of the wafer is high and in the area where it is low, while they almost correspond in the medium-speed area. Accordingly, it is seen from FIG. 10 that the rotation speed in the medium-speed rotation area where uniformity over a surface of treatment of the wafer becomes best does not depend on the flow rate of the etching gas if the exhausting rate from the inner chamber is constant.

Figure 11:
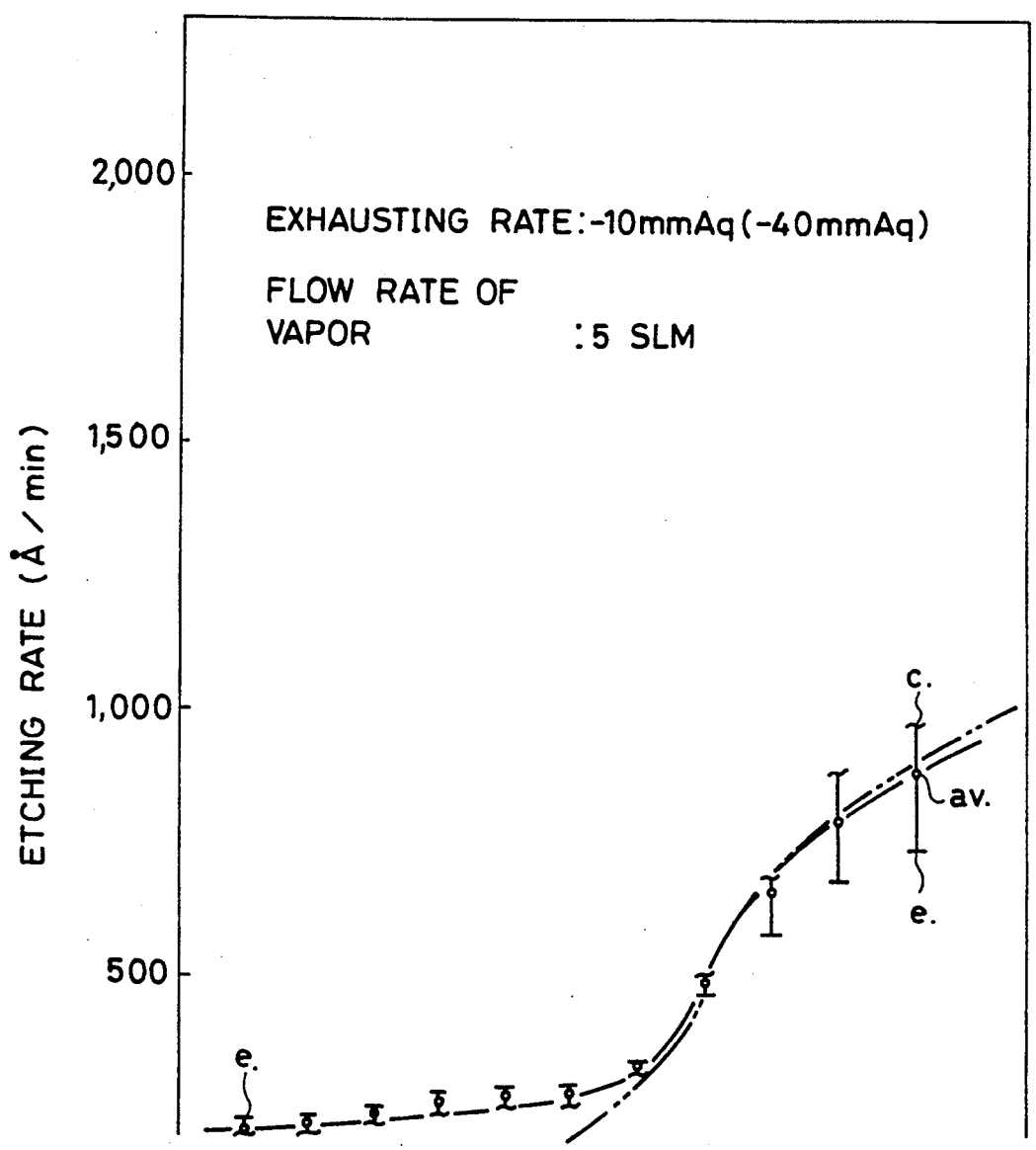

FIG. 11 illustrates a mean etching rate curve representing the relation between the rotation speed of a wafer and the etching rate when the flow rate of the gas for treating the surface of the wafer was 5SLM, and the exhausting rate was −10 mmAq (when the inner chamber was open) (it was −40 mmAq when the inner chamber was closed).

The applicant of the present application found out from the mean etching rate curves illustrated in FIGS. 4 to 7, 9 and 11 that there is a certain relation as shown by the following formula between the rotation frequency $x$ (rpm) of the wafer and the etching rate $f(x)$ (Å/min):

$$f(x) = A(x-B)^{\frac{2m-1}{2m+1}} + C \quad (1)$$

The values of A, B, C and m are defined as described in the following, respectively.

The value of A depends on the ratio v (SLM) of hydrogen fluoride (HF) vapor and is represented by:

$$A=g(v) \quad (2)$$

In the above series of experiments, the value of A is 19.10 when the flow rate of the gas for surface treatment is 5SLM, 17.46–19.76 when it is 10SLM, and 49.70–51.00 when it is 20SLM. When the flow rate of the gas for surface treatment is in a range other than these values, it naturally takes a value obtained by interpolating or extrapolating these values.

The value of P depends on the exhausting rate from the inner chamber (the pressure in the chamber) p (mmAq) and is represented by:

$$B=h(p) \quad (3)$$

In the above series of experiments the value of P is 312 when the exhausting ratio is −5 mmAq, 404 when it is −10 mmAq, 404 when −15 mmAq, and 450 when it is −20 mmAq, for example.

The value of C depends on the flow rate v (SLM) of the gas for surface treatment and also depends on the temperature t (° C.) of the hot plate and hydrogen fluoride (HF) vapor and is represented by:

$$C=i(v, t) \quad (4)$$

In the above series of experiments, the value of C is 505 when the flow rate of the vapor is 5SLM, 595–600 when it is 10SLM, and 650–760 when it is 20SLM, in a case where the temperature is maintained at 23° C., for example.

The value of m also depends on the flow rate v (SLM) of the gas for surface treatment as A does, and it is represented by:

$$m=j(v) \quad (5)$$

In the above series of experiments, the value of m is 1 when the flow rate of the gas for surface treatment is 5SLM, 1 when it is 10SLM, and 2 when it is 20SLM, for example.

A function f(x) of the etching rate under the condition of the experiments illustrated in the figures was determined by selecting constants A, B, C, and m so that function f(x) most approximates the mean etching rate curves illustrated in FIGS. 4–7, 9 and 11. The obtained curved lines of the function of the etching rate are indicated by two-dot chain lines in FIGS. 4–7, 9, and 11, superposed on the mean etching rate curves, respectively.

As seen from the above respective figures, the curve of the function and the observed mean etching rate curve correspond well in an area of rotation speed higher than the medium speed of the wafer. However, as the exhausting rate from the inner chamber becomes larger, the function curve departs from the mean etching rate curve in the low-speed rotation area of the wafer. The function curve and the observed curved line also become not correspondent with each other in the low-speed rotation area of the wafer when the flow rate of the gas for treating the surface of the wafer is small. Accordingly, it looks like the balance between the rate of the vapor supplied into the inner chamber and the rate of the vapor exhausted from the inner chamber is important in order to make the observed curves and the function curve correspond well with each other. However, the determined function curve and the observed mean etching rate curve correspond well with each other at least in the area above the medium-speed rotation region of the wafer, which is important in the present invention.

Figure 12:
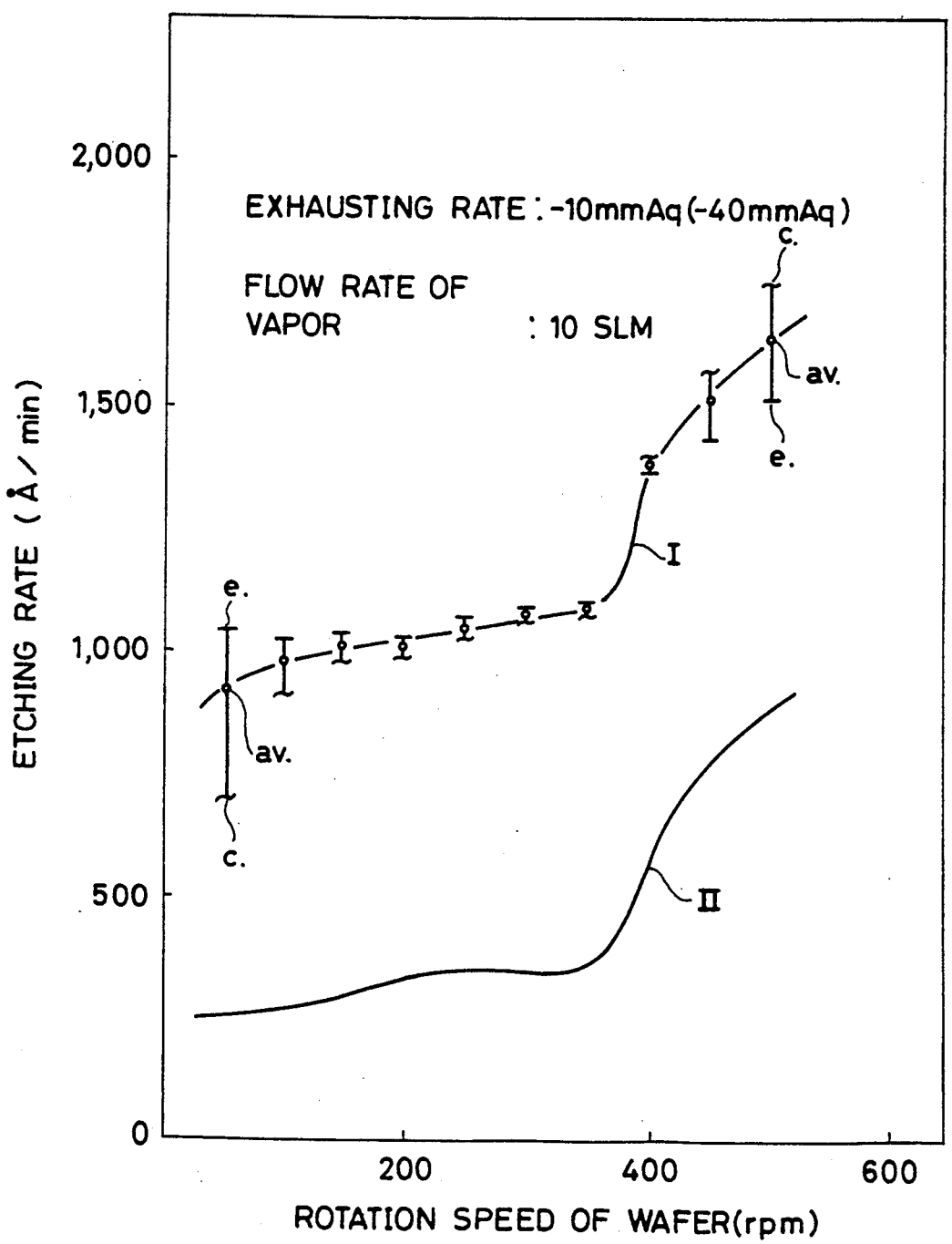

FIG. 12 illustrates a mean etching rate curve I obtained by an experiment carried out with the different rotation speeds of the wafer under the condition wherein the flow rate of the gas for treating the wafer was 10SLM, the exhausting rate from the inner chamber was −10 mmAq (when the inner chamber was open) (−40 mmAq when the inner chamber was closed), the temperature of hydrogen fluoride (HF) vapor was 30° C., and the temperature of wafer W (the temperature of the hot plate) was 23° C. Curve II illustrated in FIG. 12 is the mean etching rate curve illustrated in FIG. 5. The result illustrated in FIG. 5 was obtained by an experiment carried out with the temperature of hydrogen fluoride (HF) vapor and the temperature of wafer W (the temperature of the hot plate) both at 23° C. as described above and with the other being the same as those for curve I.

It is seen that the two curves I, II illustrated in FIG. 12 have almost the same basic form, and curve I can be obtained by shifting curve II upward. It is seen that the temperature of the environment in which the experiment is carried out influences only the value of variable C in etching rate function f(x) shown by expression (1). As the temperature becomes higher, variable C is increased, and the mean etching rate curve is shifted upward.

The following is seen by observing the mean etching rate curves obtained by the above experiments. The slope of the mean etching rate curve is relatively gentle when the rotation speed of the wafer is low, relatively steep in the medium-speed rotation area, and gentle again in the area of high rotation speed. The rate of surface treatment in the vicinity of the central part of the wafer and the rate of surface treatment in the peripheral part almost correspond with each other at the point where the slope of the mean etching rate curve becomes steep, and the comparison result is inverted near that point. The rotation frequency of the wafer which brings such a result approximately corresponds to the inflection point of the mean etching rate curve.

The followings are derived from the results of the above series of experiments. The whole surface of a wafer is treated most uniformly when the wafer is rotated at a rotation speed corresponding to the inflection point of function f(x) indicating the relation between the rotation speed of the wafer and the etching rate. The result of a comparison between the etching rate in the central part of the wafer and the etching rate in the peripheral part is inverted at the inflection point. Etching rate function f(x) is represented well by formula (1).

As is well known, the inflection point of function f(x) is given by x at which the value of the second derivative f″(x) is equal to 0. Specifically, according to the expression (1), the curved line of function f(x) has the inflection point at x=B. The value of function f(x) at that time becomes equal to C.

Form the above facts, it is possible to determine the rotation speed of the wafer which makes uniformity best over a surface in surface treatment of the wafer as described in the following.

Figure 13:
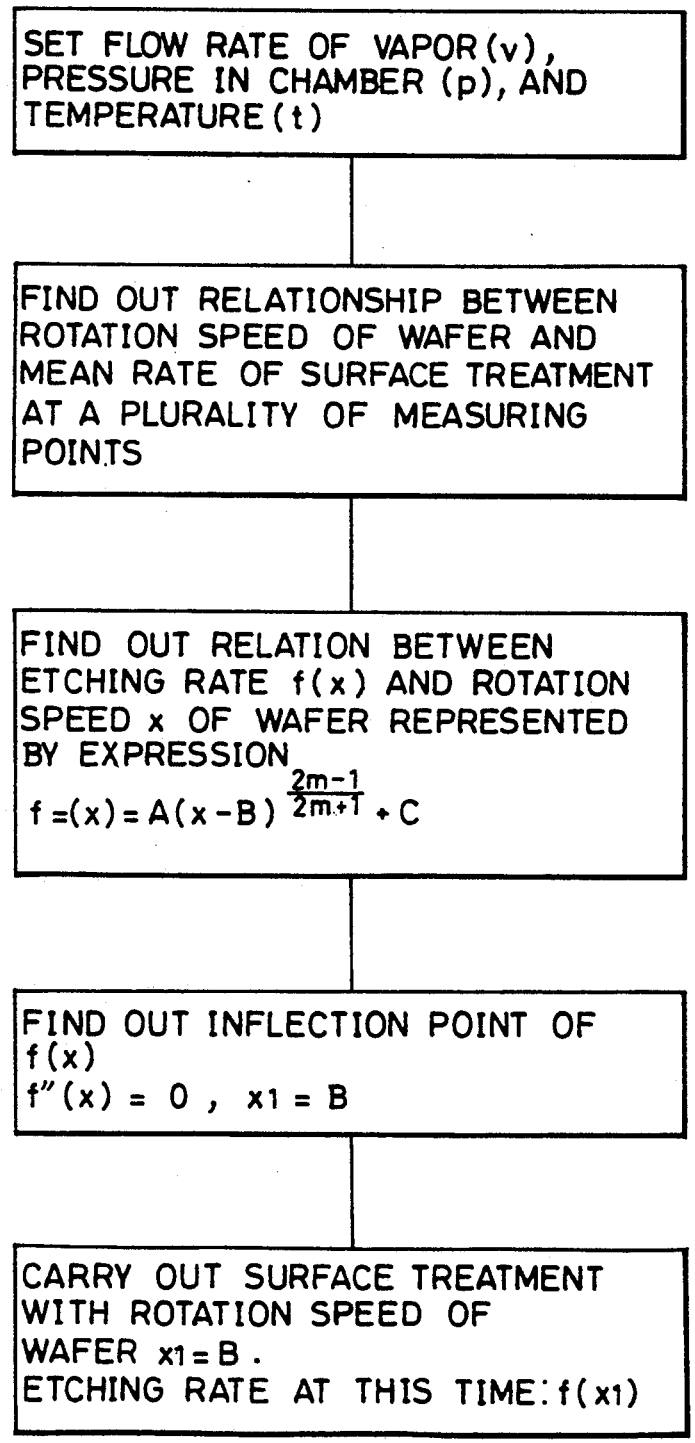
FIG. 13 is a flow chart illustrating a procedure for carrying out a method according to the present invention.

Referring to FIG. 13, as illustrated in a step S1, the flow rate v of the gas for surface treatment, the pressure p in the chamber, and the temperature t on the occasion of surface treatment of a product wafer is set first. Subsequently, in a step S2, the relationship between the rotation frequency of the wafer and the mean speed of surface treatment at a plurality of measuring points is found out. The above respective expressions (2)–(5) are determined from that result. The values of variables A, B, C and m in expression (1) are determined, respectively, by substituting flow rate v of the gas for surface treatment, pressure p in the chamber, and temperature t which have been set in determined expressions (2)–(5). Specifically, in a step S3, function f(x) is determined by determining these variables.

In a step S4, a value of a rotation speed x: at which makes the value of the second derivative of the found function f(x) becomes 0 is found out. In this case, it is clear from formula (1) that $x_1=B$. Subsequently, in a step S5, surface treatment of a wafer is carried out while rotating the wafer at a obtained rotation speed $x_1$ (=B) of the wafer. Thus, surface treatment of the wafer can be carried out with the best uniformity over the whole surface of the wafer for the above-described reason. The etching rate at this time is obtained by replacing x with B in expression (1). Specifically, the etching rate is equal to C. Therefore, it is possible to determine the processing time for etching easily from expression (1).

It is possible to enhance uniformity over a surface in surface treatment of a wafer with high repeatability by carrying out surface treatment of a wafer in accordance with this method. Accordingly, it is possible to greatly enhance the quality of semiconductor devices or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of treating a main surface of a wafer by supplying a surface treating gas to said main surface, said method comprising the steps of:
   rotating said wafer about a center portion of said wafer;
   measuring a rotational speed of said wafer;
   determining when said rotational speed of said wafer is at a first rotation speed
   wherein at rotational speeds higher than said first rotation speed, a differential between a rate of surface treatment in the vicinity of the center portion of said main surface of said wafer and a rate of surface treatment in a peripheral portion of said main surface of said wafer is of a first sign, and at rotational speeds lower than said first rotation speed, said differential is of a second sign opposite said first sign; and
   supplying said surface treating gas to said main surface of said wafer while rotating said wafer at said first rotation speed.

2. The method according to claim 1, wherein said step of determining when said rotational speed of said wafer is at said first rotation speed includes the sub-steps of:
   rotating a test wafer, that is similar to said wafer, about a center portion of said test wafer;
   measuring a rotational speed of test wafer;
   determining when said rotational speed of said wafer is at a second rotation speed
   wherein at rotational speeds higher than said second rotation speed, a differential between a rate of surface treatment in the vicinity of the center portion of said test wafer and a rate of surface treatment in a peripheral portion of said test wafer is of a first sign, and at rotational speeds lower than said second rotation speed, said differential is of a second sign opposite said first sign;
   selecting said first rotation speed equal to said second rotation speed.

3. The method according to claim 2, wherein said step of determining when the rotational speed is at said second rotation speed includes the sub-steps of:
   preparing a plurality of said test wafers;
   treating a main surface of said test wafers, while rotating said test wafers at different rotational speeds;
   determining a function representing the relation between a mean treatment rate in said main surface of each of said test wafers and the rotational speeds of said test wafers; and
   determining a rotational speed corresponding to a inflection point of said function; and
   selecting said rotational speed as said second rotation speed.

4. The method according to claim 3, wherein said step of treating said main surface of said test wafer is carried out with the flow rate, the pressure, and the temperature of said surface treating gas being kept at respective predetermined constant values.

5. The method according to claim 4, wherein said step of determining said function includes the sub-steps of:
  obtaining said mean treatment rate at a plurality of measuring points on said main surface of each of said test wafers;
  plotting a series of points, each of which represents a relationship between said mean treatment rate and the rotational speed of each of said test wafers; and
  estimating a curved line from said series of points with high correlation with said series of points.

6. The method according to claim 4, wherein said function representing said mean treatment rate is defined by the following expression:

$$f(x) = A(x - B)^{\frac{2m-1}{2m+1}} + C$$

wherein x indicates the rotational speed of said water,
  f(x) indicates the mean rate of surface treatment of said wafer,
  A is a variable determined depending on the flow rate of said surface treating gas,
  B is a variable determined depending on the pressure in a chamber in which said surface treatment is carried out,
  C is a variable determined depending on the flow rate and the temperature of said surface treating gas,
  m is a variable determined depending on the flow rate of said surface treating gas, and
  said first and second rotation speeds are selected to be equal to the value of said variable B.

7. The method according to claim 6, wherein said gas for surface treatment includes a gas for etching processing.

8. The method according to claim 7, wherein said gas for etching processing includes hydrogen fluoride (HF) vapor.

9. The method according to claim 8, wherein said variable A takes the values of 19.1, 17.46 to 19.76, and 49.70 to 51.00 for the values of the flow rate of said surface treating gas of 5, 10, and 20SLM, respectively, and takes the values obtained by mathematically manipulating these values for other values of the flow rate of said surface treating gas.

10. The method according to claim 8, wherein the value of said variable B takes values of 312, 404, 404, and 450 for values of the pressure in said chamber of −5 mmAq, −10 mmAq, −15 mmAq and −20 mmAq, respectively, and takes values obtained by mathematically manipulating these values for other values of the pressure in said chamber.

11. The method according to claim 8, wherein said variable m is selected to take values of 1, 1, and 2 for values of the flow rate of said gas for surface treatment of 5, 10, and 20SLM, respectively, and selected to take values obtained by mathematical manipulating these values for other values of the flow rate of said surface treating gas.

12. The method according to claim 8, wherein said variable C is selected to be values of 505, 595 to 600, and 650 to 760 for values of the flow rate of said gas for surface treatment of 5, 10, and 20SLM, respectively, when the temperature of said gas for surface treatment is 23° C., and it is selected to take values obtained by mathematical manipulating these values for other values of the flow rate of said surface treating gas.

13. In a method of treating a main surface of a wafer by supplying a surface treating gas to said main surface of said wafer while rotating said wafer around an axis vertical to said main surface at a predetermined first rotating speed, a method of determining said first rotation speed comprising the steps of:
  determining a second rotation speed of a test wafer, that is similar to said wafer, wherein at rotational speeds higher than said second rotation speed, a differential between a rate of surface treatment in the vicinity of a center portion of said test wafer and a rate of surface treatment in a peripheral portion of said test wafer is of a first sign, and at rotational speeds lower than said second rotation speed, said differential is of a second sign opposite said first sign; and
  selecting the value of said first rotation speed to be equal to the value of said second rotation speed.

14. The method according to claim 13, wherein said step of determining said second rotation speed includes the sub-steps of:
  preparing a plurality of said test wafers;
  treating said main surface of said test wafer while rotating said test wafers at different rotational speeds;
  determining a function representing a relationship between a mean treatment rate in said main surface of each of said test wafers and the rotational speeds of said test wafers; and
  determining a rotational speed of said test wafers corresponding to a inflection point of said function; and selecting said rotational speed as said second rotation speed.

15. The method according to claim 14, wherein said step of treating said main surface of said test wafers is carried out with the flow rate, the pressure, and the temperature of said surface treating gas being kept at respective predetermined constant values.

16. The method according to claim 15, wherein said step of determining said function includes the sub-steps of:
  obtaining said mean treatment at a plurality of measuring points on said main surface of each of said test wafers;
  plotting a series of points, each of which represents a relationship between said mean treatment rate and the rotational speed of each of said test wafers; and
  estimating a curved line from said series of points with high correlation with said series of points.

17. The method according to claim 15, wherein said function representing said mean treatment rate is defined by the following expression:

$$f(x) = A(x - B)^{\frac{2m-1}{2m+1}} + C$$

wherein x indicates the rotational speed of said wafer,
  f(x) indicates the mean treatment rate of said wafer,
  A is a variable determined depending on the flow rate of said gas for surface treatment,
  B is a variable determined depending on the pressure in a chamber where said surface treatment is carried out,
  C is a variable determined depending on the flow rate and the temperature of said surface treating gas, and m is a variable determined depending on the flow rate of said surface treating gas, and wherein the values of said first and second rotation speeds are selected to be equal to the value of said variable B.

18. The method according to claim 17, wherein said surface treating gas includes a gas for etching processing.

19. The method according to claim 18, wherein said gas for etching processing includes hydrogen fluoride (HF) vapor.

20. The method according to claim 19, wherein said variable A takes values of 19.1, 17.46 to 19.76, 49.70 to 51.00 for values of the flow rate of said surface treating gas of 5, 10, and 20SLM, respectively, and takes values obtained by mathematically manipulating these values for other values of the flow rate of said surface treating gas.

21. The method according to claim 19, wherein the value of said variable B takes values of 312, 404, 404, and 450 for values of the pressure in said chamber of −5 mmAq, −10 mmAq, −15 mmAq, and −20 mmAq, respectively, and takes values obtained by mathematically manipulating these values for other values of the pressure in said chamber.

22. The method according to claim 19, wherein the value of said variable m is selected to take values of 1, 1, and 2 for values of the flow rate of said gas for surface treatment of 5, 10, and 20SLM, respectively, and selected to take values obtained by mathematically manipulating these values for values for other values of the flow rate of said surface treating gas.

23. The method according to claim 19, wherein said variable C is selected to take values of 505, 595 to 600, and 650 to 760 for values of the flow rate of said gas for surface treatment of 5, 10, and 20SLM, respectively, when the temperature of said gas for surface treatment is 23° C., and it is selected to take values obtained by mathematically manipulating these values for other values of the flow rate of said gas for surface treatment.

* * * * *

UNITED STATES PATENT AND TRADEMARK OFFICE
CERTIFICATE OF CORRECTION

PATENT NO. : 5,248,380
DATED : September 28, 1993
INVENTOR(S) : Masato TANAKA

It is certified that error appears in the above-indentified patent and that said Letters Patent is hereby corrected as shown below:

On the title page, please delete the Assignee's name and insert the following therefor:
--Dainippon Screen Manufacturing Co., Ltd.--.

Signed and Sealed this

Twenty-second Day of August, 1995

Attest:

BRUCE LEHMAN

*Attesting Officer*      *Commissioner of Patents and Trademarks*